(12) United States Patent
Youchison et al.

(10) Patent No.: US 7,838,083 B1
(45) Date of Patent: Nov. 23, 2010

(54) ION BEAM ASSISTED DEPOSITION OF THERMAL BARRIER COATINGS

(75) Inventors: Dennis L. Youchison, Albuquerque, NM (US); Jimmie M. McDonald, Albuquerque, NM (US); Thomas J. Lutz, Albuquerque, NM (US); Michail A. Gallis, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 1204 days.

(21) Appl. No.: 11/343,127

(22) Filed: Jan. 28, 2006

Related U.S. Application Data

(60) Provisional application No. 60/648,299, filed on Jan. 28, 2005.

(51) Int. Cl.
| | |
|---|---|
| C23C 14/08 | (2006.01) |
| C23C 14/30 | (2006.01) |
| C23C 14/48 | (2006.01) |
| C23C 14/54 | (2006.01) |
| B05D 3/06 | (2006.01) |

(52) U.S. Cl. .............. 427/529; 427/528; 427/567; 427/595; 427/597; 427/533

(58) Field of Classification Search .............. None
See application file for complete search history.

(56) References Cited

U.S. PATENT DOCUMENTS

| | | | | |
|---|---|---|---|---|
| 5,077,112 A | * | 12/1991 | Hensel et al. | 428/76 |
| 5,512,382 A | | 4/1996 | Strangman | |
| 5,556,713 A | | 9/1996 | Leverant | |
| 5,630,314 A | * | 5/1997 | Kojima et al. | 60/39.182 |
| 5,652,044 A | | 7/1997 | Rickerby | |
| 5,780,110 A | * | 7/1998 | Schaeffer et al. | 427/327 |
| 5,849,370 A | * | 12/1998 | Lee et al. | 427/562 |
| 5,981,088 A | | 11/1999 | Bruce et al. | |
| 5,998,003 A | | 12/1999 | Courtright et al. | |
| 6,123,997 A | | 9/2000 | Schaeffer et al. | |
| 6,478,888 B1 | | 11/2002 | Burns | |
| 6,485,845 B1 | * | 11/2002 | Wustman et al. | 428/633 |
| 6,521,293 B1 | * | 2/2003 | Kojima et al. | 427/250 |
| 6,586,115 B2 | | 7/2003 | Rigney et al. | |
| 6,589,351 B1 | | 7/2003 | Bruce | |
| 6,591,636 B1 | * | 7/2003 | Forenz et al. | 65/374.11 |
| 6,610,419 B1 | * | 8/2003 | Stamm | 428/632 |
| 6,617,049 B2 | | 9/2003 | Darolia | |
| 6,946,034 B1 | | 9/2005 | Bruce | |
| 6,983,718 B1 | | 1/2006 | Bruce | |
| 7,229,675 B1 | * | 6/2007 | Paderov et al. | 427/529 |

(Continued)

FOREIGN PATENT DOCUMENTS

EP 0985745 A1 3/2000

(Continued)

OTHER PUBLICATIONS

Reinhold et al., "EB-PVD process management for highly productive zirconia thermal barrier coating of turbine blades", Surface and Coatings Technology 120-121 (1999) 77-83.

(Continued)

*Primary Examiner*—Marianne L Padgett

(57) ABSTRACT

Methods and apparatus for depositing thermal barrier coatings on gas turbine blades and vanes using Electron Beam Physical Vapor Deposition (EBPVD) combined with Ion Beam Assisted Deposition (IBAD).

19 Claims, 2 Drawing Sheets

U.S. PATENT DOCUMENTS

| | | | | |
|---|---|---|---|---|
| 7,435,443 | B2 * | 10/2008 | Jiang | 427/2.1 |
| 2003/0080085 | A1 * | 5/2003 | Greenberg et al. | 216/20 |
| 2004/0258851 | A1 * | 12/2004 | Selvamanickam et al. | 427/551 |
| 2005/0268662 | A1 * | 12/2005 | Moore et al. | 65/374.11 |
| 2006/0046070 | A1 * | 3/2006 | Jiang | 428/432 |

FOREIGN PATENT DOCUMENTS

| | | | |
|---|---|---|---|
| WO | WO 01/61066 A1 * | 8/2001 | |
| WO | WO 2005/002020 A2 | 1/2005 | |

OTHER PUBLICATIONS

Nicholls et al., "Advanced Processing of TBC's forReduced Thermal Conductivity", Proc. 85th Mtg. of the AGARD Structures and Materials Panel, Aalborg, Denmark Oct. 1997.

Schulz et al., "Graded Design of EB-PVD Thermal Barrier Coating Systems", Proc. 85th Mtg. of the AGARD Structures and Materials Panel, Aalborg, Denmark Oct. 1997.

W.A. Bowlin et al., "EBPVD TBC Implementation at PST," ebeam2004 Reno, NV, Oct. 18-19, 2004.

D.L. Youchison et al., "Effects of ion beam assisted deposition, beam sharing and pivoting in EB-PVD processing of graded thermal barrier coatings, Surface and Coatings Technology", vol. 177-178, pp. 158-164, printed Jan. 30, 2004.

* cited by examiner

ION BEAM ASSISTED DEPOSITION OF THERMAL BARRIER COATINGS

CROSS-REFERENCE TO RELATED APPLICATIONS

This application claims the benefit of U.S. provisional patent application Ser. No. 60/648,299 filed Jan. 28, 2005, which is incorporated herein by reference.

FEDERALLY SPONSORED RESEARCH

The United States Government has rights in this invention pursuant to Department of Energy Contract No. DE-AC04-94AL85000 with Sandia Corporation.

BACKGROUND OF THE INVENTION

The present invention relates generally to materials and methods used for depositing thermal barrier coatings on gas turbine blades/vanes using Electron Beam Physical Vapor Deposition (EBPVD) combined with Ion Beam Assisted Deposition (IBAD).

Higher operating temperatures for gas turbine engines are continuously sought in order to increase their efficiency. Ceramic thermal barrier coatings (TBCs) have been used since the 1970's to protect gas turbine blades and vanes (typically made of iron, nickel, or cobalt-based superalloys) from oxidation and corrosion; and to minimize their service temperatures by providing thermal insulation. Zirconia ($ZrO_2$) that is partially or fully-stabilized by yttria ($Y_2O_3$), magnesia (MgO) or other oxides is widely employed as the TBC. TBCs commonly use YSZ (Yttria Stabilized Zirconia), which can contain 2-17% yttrium, and more usually 6-8% yttrium. Zirconia-based TBCs (e.g., YSZ) produced by electron beam physical vapor deposition (EBPVD) have superior adhesion and enhanced thermal strain compliance due to their columnar grain morphology. However, they possess higher thermal conductivities (e.g., 2 W/m-K) compared to plasma-sprayed YSZ (e.g., 1 W/m-K). The plasma sprayed coatings have a lamellar, splat-like, layered microstructure that increases thermal resistance. The higher thermal conductivity of EBPVD coatings is believed to result from the deposition of relatively high-density columnar grains oriented perpendicular to the substrate, with little internal microporosity or other defects to resist the flow of heat. A lower thermal conductivity is desirable in order to increase component lifetimes by allowing a thinner, lighter ceramic coating to be used; and to achieve higher turbine efficiencies due to the possible increase in gas temperature and due to a reduction in the cooling-power requirements for cooling the turbine blade through internal cooling passages.

FIG. 1 shows a simplified cross-section view of a typical structure of a gas turbine blade/vane coated with a TBC. The superalloy substrate 12 (e.g., a nickel-based superalloy, such as Inconel 718), is directly coated with a oxidation-resistant layer called a "bondcoat" 14, which is typically made of 1) a metallic alloy of MCrAlY, where M is iron, cobalt and/or nickel; 2) a binary NiAl alloy, or 3) an oxidation-resistant intermetallic compound, e.g., nickel-aluminide ($Ni_2Al_3$) or platinum aluminide (PtAl). The most common bondcoat used on nickel-based superalloys is diffusion nickel-aluminide, typically 25-125 microns thick, and more commonly around 40-50 microns thick. It is conventionally made by diffusing a layer of pure aluminum (e.g., 30-50 microns thick) into the superalloy substrate at 800-900° C. for 2-3 hours, whereupon the diffused aluminum reacts with the underlying nickel to form a well-adhered, nickel-aluminide bondcoat 14.

On top of the bondcoat 14 is a thin adhesion layer 16, typically comprising pure alumina. The adhesion layer 16 is typically made by the following process. A few microns of pure aluminum are usually left over on the surface of the nickel-aluminide bondcoat following the 2-3 hour aluminiding step mentioned above. After performing an optional grit-blasting step to clean and roughen the surface, the aluminum is then controllably oxidized into a few microns of pure alumina ($Al_2O_3$) by heating the substrate to an elevated temperature (e.g., 800-1000° C.) in an oxygen-containing atmosphere for 2-4 hours. This layer of thermally grown oxide (TGO) is about 0.1-2.0 microns thick, and preferably about 1 micron thick. Excessively thick TGO layers (e.g., 10 microns) can cause premature TBC failures. It is difficult to achieve precise control of the thickness of the TGO adhesion layer 16 due to many variables, including: the local oxygen concentration adjacent the part in the vacuum chamber, impurities (such as water vapor), non-uniform pre-heat temperature profiles across the part, the aluminum activity in the bond coat, surface impurities, exposure time, and specific temperature history (e.g., a longer heat-up time is needed for heavier parts).

Next, a zirconia-based ceramic TBC layer 18 is deposited to a thickness of about 30-300 microns directly on top of the adhesion layer 16, usually by an EB-PVD process. The alumina adhesion layer 16 provides good chemical bonding and adhesion of the EBPVD YSZ layer 18 to the underlying aluminide bondcoat. The YSZ layer deposited by EBPVD has dense, columnar grains oriented substantially perpendicular to the surface of the substrate, extending outwards from the bondcoat. Before starting EBPVD, the substrate 12 is typically pre-heated to about 900° C. During coating the substrate gradually increases to about 1100° C. due to radiant heating from the molten YSZ ingot (at 2300 C), and from e-beam electrons reflected from internal surfaces. Oxygen can be injected during EBPVD deposition to help insure fully stoichiometric ceramic coatings. Unfortunately, a thermally grown alumina (TGO) layer can continue to grow thicker during a conventional EBPVD process, due to the high substrate temperature (900-1100° C.). This can result in an excessively thick or non-uniform TGO adhesion layer 16.

In addition to needing accurate control over the thickness, composition, and uniformity of the alumina adhesion layer 16, it is useful to have the best crystallographic phase of the alumina. The most-desirable polymorph of alumina is alpha-phase alumina ($\alpha$-$Al_2O_3$), because it has the highest thermal stability and a low oxygen diffusivity. Typically, an alpha-phase alumina layer 16 is formed by post-coating annealing at high temperatures of the TGO alumina layer. This requires annealing at 1200 C for 9 hours to convert the amorphous alumina into a "mature" alpha-phase alumina. By "mature", we mean that at least 90% of the alumina comprises the alpha-phase, $\alpha$-$Al_2O_3$. The literature reports that post-coating annealing at 1000° C. for 9 hours was unable to convert the amorphous alumina; while annealing at 1100° C. for 1 hour only partially produced an alpha-phase.

EBPVD deposition of alumina has also been studied. According to the literature, alumina coatings deposited via EBPVD on substrates heated to as high as 980° C. still had an amorphous structure. Only when doing EBPVD at substrate temperatures greater than 1100° C. did a "mature" alpha-phase form.

It has also been reported that grit-blasting the aluminide bondcoat 14 prior to depositing EBPVD alumina helps to nucleate the desired alpha-phase. Alternatively, it has been reported that embedding (seeding) small particles of alpha-phase alumina into the bondcoat prior to depositing alumina has also been reported to help nucleate the desired alpha-phase.

It is also desirable to reduce the oxygen partial pressure during EBPVD deposition as much as possible for a number of reasons, including extending the to lifetime of hot cathode electron emitters (e.g., in the ion source, e-beam gun, or other exposed hot filaments).

Reducing the total processing time will greatly reduce costs by increasing the throughput rates. Up to 12 hours of processing time could be saved by eliminating the need to thermally-grow the alumina adhesion layer (i.e., alumina "scale"), and by eliminating the need to perform high-temperature annealing to convert the alumina scale in the desirable alpha-phase. These savings can be achieved by combining Ion Beam Assisted Deposition (IBAD) with EBPVD. Against this background, the present invention was developed.

SUMMARY OF THE INVENTION

The present invention relates to method and apparatus for depositing thermal barrier coatings on gas turbine blades and vanes using Electron Beam Physical Vapor Deposition (EB-PVD) combined with Ion Beam Assisted Deposition (IBAD).

BRIEF DESCRIPTION OF THE DRAWINGS

The accompanying drawings, which are incorporated in and form part of the specification, illustrate various examples of the present invention and, together with the detailed description, serve to explain the principles of the invention.

DETAILED DESCRIPTION OF THE INVENTION

Figure 1:
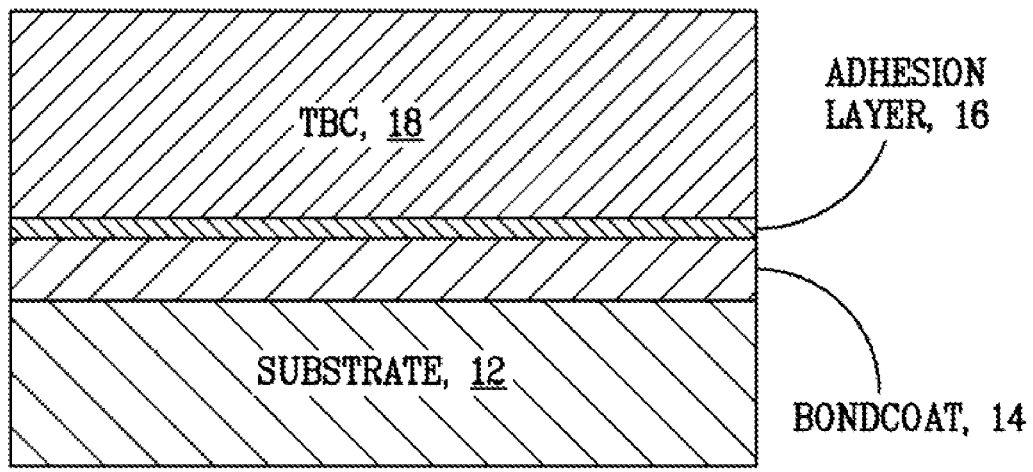
FIG. 1 shows a schematic cross-section view of a first example of a thermal barrier coating structure, 10.

FIG. 1 shows a schematic cross-section view of a first example of a thermal barrier coating structure, 10. Metallic substrate 12 can be made of a nickel-based superalloy, e.g., Inconel-718. Bondcoat 14 can be made of a nickel-aluminide ($Ni_2Al_3$), with a thickness of about 25-125 microns, preferably 40-50 microns thick. Adhesion layer 16 can be made of "mature" alumina, comprising at least 90% alpha-phase, with a thickness of 0.1-2 microns, preferably about 1 micron. Thermal barrier coating 18 can be made of YSZ (e.g., 6-8% yttria), with a columnar grain structure oriented perpendicular to the substrate, having a thickness of 30-300 microns, preferably 100-150 microns.

Figure 2:
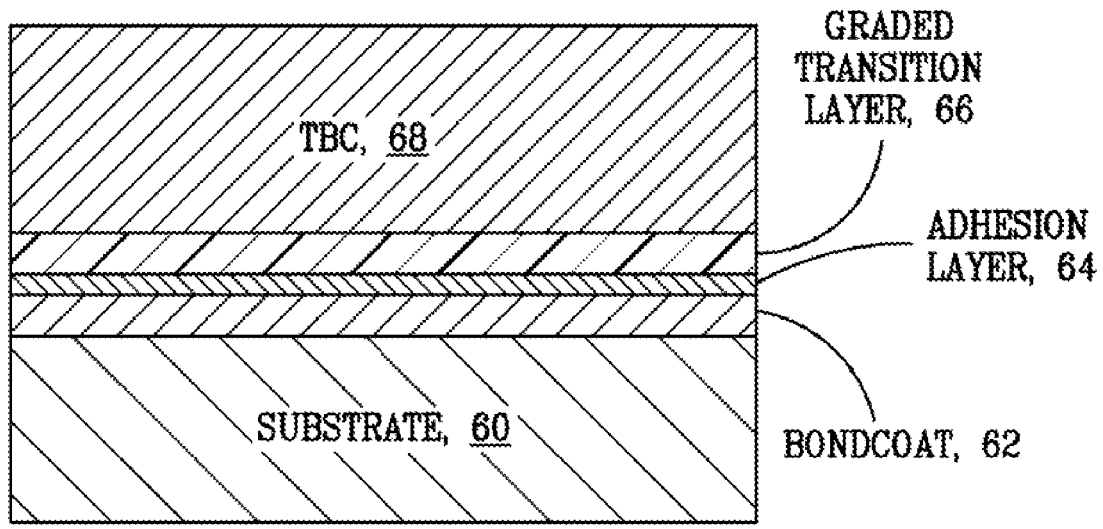
FIG. 2 shows a schematic cross-section view of a second example of a thermal barrier coating structure, 11.

FIG. 2 shows a schematic cross-section view of a second example of a thermal barrier coating structure, 11. Metallic substrate 60 can be made of a nickel-based superalloy, e.g., Inconel-718. Bondcoat 62 can be made of a nickel-aluminide ($Ni_2Al_3$), with a thickness of about 25-125 microns, preferably 40-50 microns thick. Adhesion layer 64 can be made of "mature" alumina, comprising at least 90% alpha-phase, with a thickness of 0.1-2 microns, preferably about 1 micron. Graded transition layer 66 can comprise essentially pure EBPVD alumina at the bottom of layer 66, and essentially pure EBPVD YSZ at the top of layer 66, with an atomistic mixture of alumina and YSZ graded across the thickness of the layer. The gradient in composition of layer 66 can be linear, i.e., a linear decrease in alumina concentration from bottom to top, and a linear increase in YSZ concentration from bottom to top.

One purpose of using a functionally-graded transition layer 66 is to reduce stresses in the various layers of coating system 11, by providing a more gradual transition in properties (e.g., the thermal expansion coefficient) from the underlying alumina scale (i.e., adhesion layer 64) to the YSZ TBC layer 68; rather than having an abrupt transition at the interface between pure alumina 64 and pure YSZ TBC 68. The thickness and composition gradient of graded transition layer 66 can be optimized to provide maximum stress relief, while not being so thick as to significantly increase the overall thermal conductivity of the thermal barrier system (i.e., since alumina has a higher thermal conductivity than YSZ). Thermal barrier coating 68 can be made of YSZ (e.g., 6-8% yttria), with a columnar grain structure oriented perpendicular to the substrate, having a thickness of 30-300 microns, preferably 100-150 microns.

Figure 3:
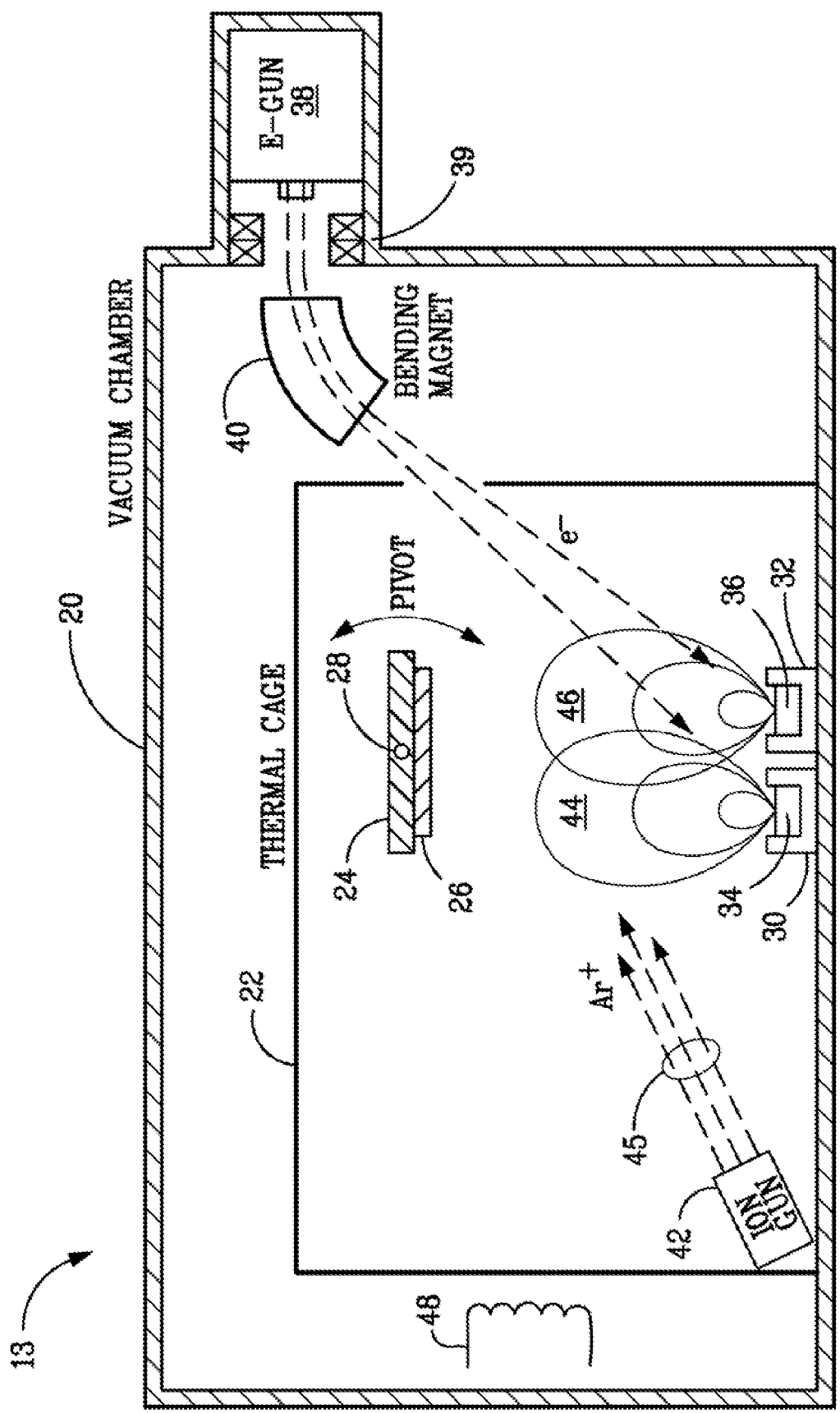
FIG. 3 shows a schematic elevation front view of an example of a combined EBPVD/IBAD coating system 13.

FIG. 3 shows a schematic elevation front view of an example of a combined EBPVD/IBAD coating system 13. Electron gun 38 is mounted horizontally on chamber 20. Bending magnet 40 deflects high energy (e.g., 40 kV) electrons emitted from e-gun 38 onto one or more source crucibles, 30 & 32, thereby heating ceramic source ingots 34 & 36 to high temperatures. Vacuum chamber 20 houses a stainless steel thermal cage 22 (i.e., oven, or "doghouse"), which is heated by heater 48, or a second e-gun (not shown). The thermal cage serves several functions. It radiatively heats the substrates, enhances recycling at the walls, and shields the cold vacuum vessel from the plume. The evaporation of ceramic material from ingots 34 & 36 form vapor plumes 44 & 46, respectively, which deposit ceramic material onto substrate 26, which is mounted to support paddle 24. Substrate 26 can be a turbine blade or vane, for example. Support paddle 24 can pivot/tilt back and forth on by rotating support rod 28. Support rod 28 can also translate the substrate 36 in and out of the vapor plumes 44, 46. Ion gun 42 is mounted inside of thermal cage 22, and bombards/irradiates substrate 26 with a collimated beam, 45, of energetic ions, which can be, for example, argon ions. A digital raster control system (not shown) controls the deflection of the e-beam spot via deflection coils 39. The e-beam spot (e.g., a 5 mm diameter spot) can be rapidly rastered (e.g., at 10 KHz) in a defined pattern (e.g., a square, rectangle, circle, ellipse, etc), while also being rapidly moved back and forth (e.g., at 1 kHz) from one crucible 30 to the other 32, and back again. The e-beam spot, or the rastered pattern (e.g., 3 cm diameter circle), can be held on each ingot of ceramic material (i.e., each crucible) for different lengths of time by timesharing the e-beam, which allows a different time-average power level to be applied to each separate ingot, 34 & 36. In other words, the digital raster control system can be programmed to make the e-beam spot dwell for a longer period of time on whichever ingot has the higher melting point and/or lower vapor pressure. For example, the e-beam raster system can be programmed to apply about 5 times as much power to a YSZ ingot than on an alumina ingot, due to the higher evaporation temperature of YSZ (2300° C.) over alumina (1900° C.). Crucibles 30, 32 can comprise a water-cooled copper hearth (not shown), with mechanical means (not shown) for raising up the cylindrical ingot vertically into the e-beam as the ingot evaporates.

The various embodiments described herein are not limited to just one or two crucibles or ingots. More than two ingots/crucibles can be heated with a digitally-rastered electron beam. Alternatively, more than one electron beam gun may be used to heat the one or more ingots. Also, multiple substrates/ targets may be coated at a time, e.g., a rack of many turbine blades. For large gas turbine blades, it may not be possible to pass an electron beam vertically down through the blades (as is typically done with vertically-oriented e-beam guns). However, the arrangement shown in FIG. 3 shows that use of a horizontal e-beam gun 38 can eliminate this problem, since the e-beam can pass underneath the structure (i.e., "rake") supporting the turbine blades and be easily deflected down onto the ingot(s), without having to pass vertically through the blades (which might hit and melt the blades).

E-beam gun 38 may comprise any type of continuous e-beam source that can generate sufficient electron energy and current to heat a ceramic ingot to evaporation temperatures. A 150 kW electron beam gun with 40 kV electron energy can be used. The digital raster e-beam control system has been described earlier. Support paddle 24 can be pivoted back and forth during EBPVD to produce a layered texture to the deposit. The angle of incidence with which the ion beam strikes the substrate can vary periodically during YSZ deposition from a minimum of zero degrees (perpendicular incidence) to a maximum of 90 degrees (grazing incidence). For example, paddle 24 can be pivoted +/−30 degrees, with a hold period at each of the two positions ranging from 10 to 90 seconds. Alternatively, the pivot angle can change continuously as a sine wave, triangle wave, or other programmed pattern. Other mechanisms and motions for manipulating the substrate may be used, such as rotating, wobbling, translating, etc., in addition to tilting or pivoting, in order to affect desirable changes in the deposited layers.

Since heat conduction in YSZ (or other ceramics) occurs primarily through phonon (lattice vibration) transport and photon (radiative) transport at high temperature, a two-pronged approach was used to lower the thermal conductivity of EBPVD YSZ coatings. First, to enhance phonon scattering, energetic argon ion bombardment was used to produce local density variations that generate strain fields and lattice defects, which effectively scatter phonons and reduce their mean free paths. A two-grid, hot cathode ion gun with collimated beam optics was used for the ion bombardment. This allows for independent control of the beam energy, current density, direction and background pressure. Secondly, grain boundaries and inter-columnar porosity (air-gaps) refract radiation and reduce photon mean free paths. In this effort, both the number of grain boundaries and the inter-columnar porosity were increased to enhance photon scattering by pivoting the substrate +/−30° about the normal at various frequencies. Using the above techniques, it was possible to produce layered structures on a sub-micron scale in EBPVD YSZ coatings, without sacrificing the desirable columnar morphology, which had significantly reduced thermal conductivity (i.e., 1.4-1.5 W/m-K).

As discussed before, the substrate can be pivoted to present different angles to the incoming vapor plume, as well as the incident ion beam. In one position, ion beam 45 impinges at a near-normal angle; while in the other the ions impinge at a near-grazing angle. This asymmetry in angle of incidence can produce periodic changes in the microstructure of the deposit, since the amount of ion sputtering and mixing due to ion impact both depend on the angle of incidence. We have discovered that this pivoting action produces periodic "zig-zag" looking microstructural features in YSZ deposits, which we believe helps to reduce the thermal conductivity.

The ion beam source (e.g., ion gun 42) can be operated continuously during EBPVD deposition. Alternatively, it can be cycled on and off during EBPVD deposition. We tested the effect of cyclically turning the ion gun ON/OFF with a 50/50 balanced On/Off duty cycle, with cycle times ranging from as short as 20 s ON/20 s OFF, to as long as 120 s ON/120 s OFF. This cyclic ion beam exposure created a layered, sub-micron thick microstructure of periodically-varying density throughout the deposit. The deposit density is probably higher when the ion gun is ON, and lower when it is OFF. The thickness of the periodic micro-layers ranged from 0.5-1 microns, and up to 10 microns, depending on the length of the cycle period. This periodic micro-layer structure also helps to reduce the thermal conductivity. We measured reduced thermal conductivities of 1.4-1.5 W/m-K (as compared to about 2 W/m-K for EBPVD YSZ coatings deposited without cyclic IBAD and without substrate pivoting). However, despite the formation of "zig-zag" features and periodic sub-micron layers, the overall microstructure of the EBPVD YSZ deposits still remain substantially columnar and oriented perpendicular to the substrate. We used 70 mm diameter YSZ ingots and 28 mm diameter alumina ingots.

The source of collimated, energetic ions in coating system 13 can be a broad-beam, dual-grid, Kaufmann-type ion source/ion gun. In our experiments, we used a Veeco Iontech ID-2500 P.S. hot-cathode Kaufmann source with dual molybdenum grids and a 3-cm diameter beam. A secondary hot-filament cathode was placed at the exit of the ion gun to provide a source of electrons to neutralize space-charge effects. However, this feature might not have actually been needed due to the presence of high-energy electrons from the e-gun 38 that are reflected off interior surfaces (e.g., such as thermal cage 22). Argon gas was supplied to the Kaufmann gun at rate of about 3-4 sccm. Other gases could be used, such as helium, krypton, neon, nitrogen, hydrogen, oxygen, etc. to supply the ion gun; however, argon is preferred due to its inertness and heavy mass (i.e., we want to maximize momentum transfer to the deposit from the energetic ions). Ion gun 42 was mounted on the floor of vacuum chamber 20, inside the thermal cage 22, at a fixed angle of about 60 degrees relative to vertical. Substrate 26 sits about 25 cm above the ceramic source ingots. In our experiments, $Ar^+$ ion currents were typically about 19-20 mA, which provided a very high ion current density of about 1.6 $mA/cm^2$ (leaving the gun). This translates to an effective normal flux of about 1 $mA/cm^2$ in a direction normal to the substrate's surface, since the ion gun 42 was inclined 60 degrees to the vertical. We estimated that a molecular flux ratio of Ar-ion flux to ZrO-molecule flux to the substrate was about 0.1. $Ar^+$ ion energies ranged from 200 eV to 600 eV, depending on the particular experiment. Greater molecular flux ratios than 0.1 may also be employed. Use of a gridded ion source (i.e., 2 or 3 grids) for ion gun 42 allows for precise control of the ion beam optics and ion trajectories. A typical divergence of a Kaufmann (2-grid) ion source can be 15 degrees, so very little beam spreading occurs over the short distance (20-40 cm) from the ion gun 42 to substrate 26. Alternatively, a special set of dual-grids can be manufactured and used for ion gun 42 that produce either a convergent beam or a non-divergent beam at the target. This is different than using a glow discharge plasma, where the substrate is DC or RF biased to 1000-2000 V, since a glow discharge plasma has no collimated beam of energetic ions impacting on a well-defined area.

The background chamber pressure in our experiments ranged 27 mPa to 267 mPa; but more typically was about 133 mPa. These background pressures were much smaller, about 5-50 times smaller, than what is conventionally used in EBPVD chambers (i.e., 500-5000 mPa). The background partial pressure of oxygen can be less than about 100 mPa during YSZ deposition. Oxygen gas was also fed into the vacuum chamber at about 0.7 to 7.5 sccm, depending on the experiment. At the lowest $O_2$ feed rate, however, non-stoichiometric YSZ coatings were produced that had a gray color, due to being lean in oxygen. Nevertheless, even with using oxygen partial pressures as low as 27 mPa, we were still able to produce stoichiometric YSZ coatings using EBPVD combined with simultaneous IBAD at 20 mA, 575 eV $Ar^+$ bombardment; and at an oxygen partial pressure more than one order of magnitude lower than what is conventionally used.

We kept the thermal cage at 500-600° C., which is considerably colder than the 900° C. typically used in conventional EBPVD systems. Since our thermal cage is much colder, our substrate temperatures were correspondingly colder, i.e., from 600-750° C., during EBPVD deposition. By contrast, in conventional EBPVD systems the preferred substrate temperatures are much higher, i.e., 950-1000° C.

We found that combining IBAD with EBPVD allowed high-quality YSZ thermal barrier coatings to be deposited at lower substrate temperatures (i.e., lower by about 200-400° C. lower), while using less injected oxygen, and while still retaining full YSZ stoichiometry. This is possible because the energetic ion flux causes more oxygen to be incorporated into the growing YSZ film. We discovered, however, that trying to deposit YSZ at these lower substrate temperatures without using IBAD resulted in a gray-colored deposit (not pure-white, as was usually the case), due to the coating being lean in oxygen. We believe that by delivering momentum to the surface using energetic Ar-ions, the surface atoms have more energy to rearrange and mix. That means that fresh $ZrO_x$ is being exposed at the surface, which can then combine with available free atomic oxygen to form $ZrO_2$ and reach full stoichiometry. Without the ability to generate the extra energy (via a higher substrate temperature, or, via a momentum flux) too much of the $ZrO_x$ is shielded from the low-energy oxygen lying at the surface. Also, the incoming Ar-ions may disassociate $O_2$ adsorbed on the surface into free atomic oxygen for incorporation into $ZrO_x$. Molecular $O_2$ is not reactive. One must create a source of atomic O near the surface and then expose it directly to $ZrO_x$. Atomic oxygen recombines very quickly to form $O_2$; so the reaction must be close to the surface. If either species ($ZrO_x$ or O) are not available in sufficient quantity, then sub-stoichiometric, gray-colored YSZ will be produced (as we discovered).

The additional momentum imparted to the growing adatom film from the impinging $Ar^+$ ions also helps to produce smaller grains, and helps to reduce porosity by allowing the film atoms to more easily mix and move laterally on the surface, filling in any available space that normally would lead to porosity due to shadowing of growing grains from the line-of-sight PVD atoms. Having many small columnar grains with space between them lowers the thermal conductivity, which is desirable. However, as the film grows thicker, competition between grains results in some being shadowed, while others grow larger. The larger grains result in higher thermal conductivity. This ultimately limits the thickness of the TBC because there is a diminishing return on its thermal resistance. Combining IBAD with EBPVD to keep the grain sizes small circumvents this problem, which is inherent in conventional EBPVD (i.e., EBPVD without IBAD).

Use of IBAD during EBPVD also enhances the disassociation rate of the evaporated source materials (alumina, YSZ, etc.) in the plume, which is a positive effect of the quality of the deposited films.

Also, because the substrate temperature during deposition is much lower when using IBAD, there is considerably less residual thermal stress and strain on the TBC coating structure when finally cooled back down to room temperature (i.e., cooling from 650° C. to 25° C. is much lower ΔT than when cooling down from 950° C. to 25° C.).

The collimated beam of energetic ions produced by ion gun 42 can also be used to sputter-clean impurities off of the substrate, e.g., prior to deposition; or during stoppages; after vacuum pump-downs; or in-between changes between different source materials. During ion beam sputter-cleaning, the angle of substrate 26 can be adjusted (i.e., tilted) to orient it at the optimum angle of incidence to maximize the cleaning effect.

Using EBPVD permits one to deposit a few microns of an alumina adhesion layer in minutes, as opposed to thermally-growing the alumina film by oxidizing a pure-aluminum layer into alumina at 900° C. for 2-4 hours in an oxygen-containing atmosphere, as is standard practice for making the TGO scale.

We also discovered that combining IBAD with EBPVD resulted in forming optimum crystalline phases in the deposited coatings. As before, this is likely due to the additional energy, momentum transfer, and mixing in the growing film by the energetic ion flux. We were able to produce the highly-desirable tetragonal zirconia phase in the <111> direction using EBPVD YSZ with IBAD, even though the substrate temperatures were much lower than used conventional EBPVD processes (e.g., 200° C.-400° C. lower). We used X-ray Diffraction (XRD) measurements to confirm the presence of the tetragonal zirconia phase in our YSZ deposits.

Both tetragonal $ZrO_2$ and cubic $ZrO_2$ top coats could be deposited in the EB-1200 depending on the oxygen background pressure, the ion flux, and the substrate temperature. Higher chamber pressures (133 mPa, $1 \times 10^{-3}$ Torr) and lower substrate temperature (<600° C.) without IBAD produced predominantly tetragonal $ZrO_2$ phase; whereas, lower chamber pressures (27 mPa, $2 \times 10^{-4}$ Torr) and higher substrate temperatures (~750° C.) with IBAD produced mostly cubic phase.

Likewise, we found that combining IBAD with EBPVD caused the alumina films to be transformed from the amorphous phase into the stable alpha-phase alumina, despite using a much lower substrate temperature (e.g., 600-750° C.). Hence, by using our methods, only a few minutes are needed to deposit a few microns of alumina, and to simultaneously convert the amorphous alumina into the highly desirable alpha-phase. The time needed to do this (i.e., a few minutes) is significantly faster than the conventional method of annealing the amorphous alumina film at high temperatures (1100-1200° C.) for many hours (up to 9 hours). We used X-ray Diffraction (XRD) measurements to confirm the presence of the alpha-phase in our IBAD EBPVD alumina deposits.

Therefore, these two time-consuming procedures, i.e., (1) the 2-4 hours needed to first thermally-grow the alumina adhesion layer at 900° C., and (2) the up-to-9 hours needed to transform the TGO amorphous alumina into alpha-phase alumina at 1100-1200° C., can be eliminated by combining IBAD with EBPVD, according to the methods and apparatus of the present invention.

We also performed detailed atomistic simulations of the deposition process to complement the experimental work. Direct Simulation Monte Carlo (DSMC) modeling of the EBPVD plume was undertaken using a massively-parallel, 2-D code, ICARUS, developed at Sandia National Laboratories. As an atomistic method, DSMC is ideally suited to deal with the complicated physics and chemistry of a vapor plume flow field above an evaporating ceramic ingot (or above a pair of adjacent ingots).

In the DSMC methodology a gas flow is represented by the motion of a number of "computational molecules", each of which represents a large number of real molecules. A computational molecule travels at constant velocity until it experiences a collision with another computational molecule. Collisions are binary, and change the velocities and the internal energies, but not the positions, of the colliding pair of computational molecules. It should be noted that computational molecules have three-dimensional velocity vectors for collision purposes, regardless of the dimensionality of the geometry. The result of this approach is a statistical, physical simulation of the dynamics and interactions of thousands and thousands of gas molecules.

A computational mesh was used in the DSMC method for identifying possible collision partners and to accumulate statistical information. Moments of the molecular velocity distribution function were accumulated over one or more time steps within each mesh cell to yield gas quantities such as the number density, velocity and temperature. To preclude non-physical behavior, time steps and mesh cells were constrained to be less than about one-third of a collision time and one-third of a mean free path, respectively.

Typically, the transport of 5 million computational particles representing $10^{10}$ to $10^{14}$ real molecules were simulated and run using up to 1000 processors comprising the 3-Terraflop capable massively-parallel computer (ASCI Red) at Sandia National Laboratories. Parametric studies of the oxygen injection, excitation states, chemistry, and thermal management were performed on a 2-D, axisymmetric DSMC model of the thermal cage and ingot(s).

Thermal equilibria data for YSZ and alumina were obtained from the literature, as well as partial pressure curves for $Al_2O_3$, $ZrO_2$ and $Y_2O_3$. We discovered from the experiments that high quality coatings were best obtained when both the YSZ and the alumina ingots were vaporized with sufficient thermal energy to completely disassociate their constituent molecules into their individual parts (e.g., Zr, Y, ZrO, YO, etc.). The DSMC simulations revealed that the EBPVD process can be characterized by almost collisionless transport in the plume. A limited amount of recombination occurs in the plume just above the ingot, forming ZrO; but fully stoichiometric molecules are only obtained on the hot substrate.

During EBPVD deposition of a YSZ thermal barrier coating, which can take from 10-30 minutes, there is the potential for the alumina adhesion layer 16 to grow thicker if sufficient aluminum and oxygen are available. At the higher substrate temperatures (i.e., 950-1050° C.) typically used in conventional EBPVD, this alumina "scale" can grow excessively thick and lead to premature coating failure and delamination. However, when combining IBAD with EBPVD, according to the present invention, the substrate temperature can be sufficiently low (i.e., 600-750° C.) to prevent excessive growth of the alumina scale.

The use of IBAD produced fully stoichiometric YSZ coatings even with the background $O_2$ pressure reduced by over an order of magnitude, from over 3 Pa to slightly over 0.1 Pa, and the background temperature in the thermal cage reduced by 200° C. The stoichiometry was verified with 2θ XRD scans of the coatings that show sharp peaks from the tetragonal (111) $ZrO_2$ phase. This is further validated by the intense white color of the coating. IBAD produced fully stoichiometric YSZ films at a lower thermal cage temperature of 600° C. compared to 800° C.

The present invention also relates to methods and processes for depositing thermal barrier coatings using EBPVD combined with IBAD.

In a first embodiment, the invention comprises a process for coating a metallic substrate with alpha-phase alumina, comprising:

a) preheating a metallic substrate to at least 500° C. in a vacuum chamber;
b) exposing the pre-heated substrate to a plume of alumina evaporated from an alumina ingot heated with an electron beam;
c) depositing alumina from the plume on to the substrate while simultaneously irradiating the deposit with a collimated beam of energetic ions; thereby transforming the deposited alumina into alpha-phase alumina; and
d) stopping the process when a desired thickness of the alpha-phase alumina layer has been reached.

In a second embodiment, the invention comprises a process for coating a metallic substrate with a thermal barrier coating, comprising:

a) providing a metallic substrate;
b) preheating the substrate to at least 500° C. in a vacuum chamber;
c) exposing the preheated substrate to a plume of YSZ evaporated from a YSZ ingot heated with an electron beam; and
d) depositing YSZ from the plume onto the substrate while irradiating the deposit with a collimated beam of energetic ions; and
e) stopping the process when a desired thickness of the thermal barrier coating has been reached.

In a third embodiment, the invention comprises a process for coating a metallic substrate with a thermal barrier coating, comprising:

a) providing a metallic substrate pre-coated with a bondcoat layer;
b) preheating the substrate to at least 500° C. in a vacuum chamber;
c) depositing an adhesion layer onto the bondcoat; comprising:
  1) exposing the bondcoat to a plume of alumina evaporated from an alumina ingot heated with an electron beam; and
  2) depositing alumina from the plume onto the bondcoat while simultaneously irradiating the deposit with a collimated beam of energetic ions; thereby transforming the deposited alumina into alpha-phase alumina; then
d) depositing a thermal barrier coating onto the adhesion layer; comprising:
  1) exposing the adhesion layer to a plume of YSZ evaporated from a YSZ ingot heated with the electron beam; and
  2) depositing YSZ from the plume onto the adhesion layer while irradiating the adhesion layer with the collimated beam of energetic ions; and then
e) stopping the process when a desired thickness of the thermal barrier coating has been reached.

In a fourth embodiment, the invention comprises a process for coating a metallic substrate with a thermal barrier coating, comprising:

a) providing a metallic substrate pre-coated with a bondcoat layer;
b) preheating the substrate to at least 500° C. in a vacuum chamber;
c) depositing an adhesion layer onto the bondcoat; comprising:
  1) exposing the bondcoat to a plume of alumina evaporated from an alumina ingot heated with an electron beam; and
  2) depositing alumina from the plume onto the bondcoat while simultaneously irradiating the deposit with a collimated beam of energetic ions; thereby transforming the deposited alumina into alpha-phase alumina; then d) depositing a graded transition layer onto the adhesion layer; comprising:
  1) exposing the adhesion layer to both an alumina plume from an alumina ingot heated with an electron beam and simultaneously to a YSZ plume from a YSZ ingot heated with the same, or different, electron beam; and
  2) depositing an atomistic mixture of alumina and YSZ onto the adhesion layer while irradiating the deposit with the collimated beam of energetic ions;
  wherein the composition of the graded transition layer varies continuously in a substantially linear fashion from being mostly pure alumina near the bottom of the graded layer, to being mostly pure YSZ near the top of the graded layer, produced by gradually decreasing the temperature of the alumina ingot while gradually increasing the temperature of the YSZ ingot as the graded layer grows thicker; and then e) depositing a thermal barrier coating onto the graded transition layer; comprising:
  1) exposing the graded transition layer to the plume of YSZ evaporated from the heated YSZ ingot; and
  2) depositing evaporated YSZ from the plume onto the graded transition layer while simultaneously irradiating the deposit with a collimated beam of energetic ions; and e) stopping the process when a desired thickness of the thermal barrier coating has been reached.

In some embodiments, it is not necessary to use an adhesion layer 16; the TBC layer 18 can be deposited directly onto the bondcoat layer 14.

In some embodiments, the multiple steps can be performed during single pump-down of the vacuum chamber. Also, some embodiments do not require forming the alumina adhesion layer by heating the substrate at temperatures of 900° C. or more for 2-4 hours in an oxygen-rich environment to oxidize a pure aluminum layer into aluminum oxide. Also, some embodiments do not require post-coating annealing the alumina adhesion layer to a high temperature of 1100-1200° C. for up to 9 hours to transform the alumina into alpha-phase alumina. Also, some embodiments do not require operating the thermal cage at temperatures greater than about 600° C. Also, some embodiments do not require the use of a glow discharge plasma to create ion bombardment of the substrate, neither by D.C. bias, nor by RF biasing of the substrate.

Detailed descriptions of the experimental setup and test results, as well as detailed descriptions of the computer modeling of the vapor plumes, are too lengthy to include in this specification. However, that additional information can be found in the aforementioned U.S. provisional patent application Ser. No. 60/648,299, filed Jan. 28, 2005, which is incorporated herein by reference.

The particular examples discussed above are cited to illustrate particular embodiments of the invention. Other applications and embodiments of the apparatus and method of the present invention will become evident to those skilled in the art. It is to be understood that the invention is not limited in its application to the details of construction, materials used, and the arrangements of components set forth in the following description or illustrated in the drawings.

The scope of the invention is defined by the claims appended hereto.

What is claimed is:

1. A process for coating a metallic substrate with alpha-phase alumina, comprising steps of:

a) preheating a metallic substrate to at least 500° C. in a vacuum chamber by using a heated thermal cage surrounding the substrate;

b) exposing the pre-heated substrate to a plume of alumina evaporated from an alumina ingot heated with an electron beam;

c) depositing alumina from the plume on to the substrate while simultaneously irradiating the deposit with a collimated beam of energetic ions; thereby transforming the deposited alumina into alpha-phase alumina; and d) stopping the process when a desired thickness of the alpha-phase alumina has been reached, thus forming an alpha-phase alumina coating;

wherein the thickness of the alpha-phase alumina coating is between 0.1 and 2.0 microns;

wherein the substrate temperature does not exceed 800 during the coating process;

wherein the collimated beam of energetic ions comprises argon ions with an energy between 200 and 600 eV;

wherein the process does not require performing a post-coating anneal at a temperature of at least 1100 for 2 or more hours in order to transform the deposited alumina into alpha-phase alumina;

wherein the process does not comprise exposing the substrate to a plasma glow discharge during the depositing of the alumina; and further comprising using the collimated beam of energetic ions to sputter-clean the substrate prior to depositing the alumina.

2. A process for coating a metallic substrate with a thermal barrier coating, comprising steps of:

a) providing a metallic substrate;

b) pumping down a vacuum chamber to a pressure lower than atmospheric pressure; preheating the substrate to at least 500° C. in the vacuum chamber by using a heated thermal cage surrounding the substrate; and feeding oxygen gas into the vacuum chamber; then in the vacuum chamber c) exposing the preheated substrate to a plume of yttria-stabilized zirconia (YSZ) evaporated from a YSZ ingot heated with an electron beam; and d) depositing the YSZ from the plume onto the substrate while irradiating the deposit with a collimated beam of energetic ions; and e) stopping the process when a desired thickness of the YSZ has been reached, thus forming the thermal barrier coating;

wherein the substrate temperature does not exceed 800° C. during the coating process;

wherein the collimated beam of energetic ions comprises argon ions with an energy between 200 and 600 eV;

wherein the ion beam cycles on and off during the YSZ depositing with a 50/50 balanced duty cycle, wherein the length of the ON time and OFF time ranges from between 20 and 120 seconds;

wherein the angle of incidence with which the ion beam strikes the substrate varies periodically during the YSZ depositing from a minimum of zero degrees (perpendicular incidence) to a maximum of 90 degrees (grazing incidence); and wherein the substrate pivots back and forth +/−30 degrees during the depositing, with a hold period at each of the two pivot angles ranging from 10 to 90 seconds.

3. The process of claim 2, wherein the thickness of the YSZ coating is 30-300 microns.

4. The process of claim 2, wherein the background partial pressure of oxygen is less than 100 mPa during the YSZ depositing.

5. The process of claim 2, wherein the process does not comprise exposing the substrate to a plasma glow discharge during the YSZ depositing.

6. The process of claim 2, further comprising using the collimated beam of energetic ions to sputter-clean the substrate prior to depositing the YSZ.

7. The process of claim 2, wherein a molecular flux ratio of argon-ion flux to ZrO-molecule flux to the substrate is greater than or equal to 0.1 while depositing the YSZ.

8. The process of claim 2, wherein a sufficient rate of the oxygen gas is fed into the vacuum chamber so that the YSZ formed on the substrate is fully stoichiometric YSZ.

9. A process for coating metallic substrate with a thermal barrier coating, comprising steps of:
   a) providing a metallic substrate pre-coated with a bondcoat layer;
   b) pumping down a vacuum chamber to a pressure lower than atmospheric pressure; preheating the substrate to at least 500° C. in the vacuum chamber by using a heated thermal cage surrounding the substrate; and feeding oxygen gas into the vacuum chamber; then in the vacuum chamber
   c) depositing an adhesion layer onto the bondcoat; comprising:
      1) exposing the bondcoat to a plume of alumina evaporated from an alumina ingot heated with an electron beam; and
      2) depositing alumina from the plume onto the bondcoat while simultaneously irradiating the deposit with a collimated beam of energetic ions; thereby transforming the deposited alumina into alpha-phase alumina; then
   d) depositing a thermal barrier material onto the adhesion layer; comprising:
      1) exposing the adhesion layer to a plume of yttria-stabilized zirconia (YSZ) evaporated from a YSZ ingot heated with the electron beam; and
      2) depositing the YSZ from the plume onto the adhesion layer while irradiating the adhesion layer with the collimated beam of energetic ions; and then
   e) stopping the process when a desired thickness of the thermal barrier material has been reached, thus forming the thermal barrier coating;
   wherein the thickness of the alpha-phase alumina coating is between 0.1 and 2.0 microns;
   wherein the substrate temperature does not exceed 800° C. during the coating process;
   wherein the collimated beam of energetic ions comprises argon ions with an energy between 200 and 600 eV;
   wherein the process does not require performing a post-coating anneal at a temperature of at least 1100 for 2 or more hours in order to transform the deposited alumina into alpha-phase alumina;
   wherein the ion beam cycles on and off during the YSZ depositing with a 50/50 balanced duty cycle, wherein the length of the ON time and OFF time ranges from between 20 and 120 seconds;
   wherein the angle of incidence with which the ion beam strikes the substrate varies periodically during the YSZ depositing from a minimum of zero degrees (perpendicular incidence) to a maximum of 90 degrees (grazing incidence); and
   wherein the substrate pivots back and forth +/−30 degrees during the depositing, with a hold period at each of the two pivot angles ranging from 10 to 90 seconds; and
   further comprising using the collimated beam of energetic ions to sputter-clean the substrate prior to depositing the alumina.

10. The process of claim 9, wherein the bondcoat comprises $Ni_2Al_3$.

11. The process of claim 9, wherein the process does not comprise exposing the substrate to a plasma glow discharge during the alumina depositing.

12. The process of claim 9, wherein the thickness of the YSZ coating is 30-300 microns.

13. The process of claim 9, wherein the background partial pressure of oxygen is less than 100 mPa during the YSZ depositing.

14. The process of claim 9, wherein the step a) through e) are completed within a single pump-down cycle of the vacuum chamber.

15. The process of claim 9, wherein a sufficient rate of the oxygen gas is fed into the vacuum chamber so that the YSZ formed on the substrate is fully stoichiometric YSZ.

16. A process for coating a metallic substrate with a thermal barrier coating, comprising steps of:
   a) providing a metallic substrate pre-coated with a bondcoat layer;
   b) pumping down a vacuum chamber to a pressure lower than atmospheric pressure; preheating the substrate to at least 500° C. in the vacuum chamber by using a heated thermal cage surrounding the substrate; and feeding oxygen gas into the vacuum chamber; then in the vacuum chamber
   c) depositing an adhesion layer onto the bondcoat; comprising:
      1) exposing the bondcoat to a plume of alumina evaporated from an alumina ingot heated with an electron beam; and
      2) depositing alumina from the plume onto the bondcoat while simultaneously irradiating the deposit with a collimated beam of energetic ions; thereby transforming the deposited alumina into alpha-phase alumina; then
   d) depositing a graded transition layer onto the adhesion layer; comprising:
      1) exposing the adhesion layer to both an alumina plume from an alumina ingot heated with an electron beam and simultaneously to a yttria-stabilized zirconia (YSZ) plume from a YSZ ingot heated with the same, or different, electron beam; and
      2) depositing a mixture of alumina and YSZ onto the adhesion layer while irradiating the deposit with the collimated beam of energetic ions;
      wherein—the graded transition layer varies continuously in a substantially linear fashion from being mostly pure alumina near the bottom of the graded layer, to being mostly pure YSZ near the top of the graded layer, produced by gradually decreasing the temperature of the alumina ingot while gradually increasing the temperature of the YSZ ingot as the graded layer grows thicker; and then
   e) depositing a thermal barrier material onto the graded transition layer; comprising:
      1) exposing the graded transition layer to the plume of YSZ evaporated from the heated YSZ ingot; and
      2) depositing the YSZ from the plume onto the graded transition layer while irradiating the deposit with a collimated beam of energetic ions; and f) stopping the process when a desired thickness of the thermal barrier material has been reached, thus forming a thermal barrier coating;

wherein the thickness of the alpha-phase alumina coating is between 0.1 and 2.0 microns;

wherein the substrate temperature does not exceed 800 during the coating process;

wherein the collimated beam of energetic ions comprises argon ions with an energy between 200 and 600 eV;

wherein the process does not require performing a post-coating anneal at a temperature of at least 1100° C. for 2 or more hours in order to transform the deposited alumina into alpha-phase alumina;

wherein the ion beam cycles on and off during the YSZ depositing with a 50/50 balanced duty cycle, wherein the length of the ON time and OFF time ranges from between 20 and 120 seconds;

wherein the angle of incidence with which the ion beam strikes the substrate varies periodically during the YSZ depositing from a minimum of zero degrees (perpendicular incidence) to a maximum of 90 degrees (grazing incidence); and wherein the substrate pivots back and forth +/−30 degrees during the depositing, with a hold period at each of the two pivot angles ranging from 10 to 90 seconds; and further comprising using the collimated beam of energetic ions to sputter-clean the substrate prior to depositing the alumina.

17. The process of claim 16, wherein a single electron beam is used to heat both the alumina ingot and the YSZ ingot; and further comprising timesharing the single electron beam between the alumina ingot and the YSZ ingot while depositing the graded transition layer.

18. The process of claim 16, wherein the steps a) through f) are completed within a single pump-down cycle of the vacuum chamber.

19. The process of claim 16, wherein a sufficient rate of the oxygen gas is fed into the vacuum chamber so that the YSZ formed on the substrate is fully stoichiometric YSZ.

* * * * *

UNITED STATES PATENT AND TRADEMARK OFFICE
CERTIFICATE OF CORRECTION

PATENT NO. : 7,838,083 B1
APPLICATION NO. : 11/343127
DATED : November 23, 2010
INVENTOR(S) : Dennis L. Youchison et al.

It is certified that error appears in the above-identified patent and that said Letters Patent is hereby corrected as shown below:

Column 3, line 7, "to" should be deleted.
Column 10, line 46, a space should be inserted between "of" and "YSZ".
Column 12, line 16, after "800", --°C-- should be inserted; line 21, after "1100", --°C-- should be inserted; line 36, after "C", "." should be deleted; line 49, after "C", "." should be deleted.
Column 13, line 23, after "C", "." should be deleted; line 51, after "C", "." should be deleted; line 56, after "1100", --°C-- should be inserted.
Column 14, line 29, after "C", "." should be deleted.
Column 15, line 6, after "800", --°C-- should be inserted.

Signed and Sealed this
Twenty-ninth Day of March, 2011

David J. Kappos
*Director of the United States Patent and Trademark Office*